US012782392B2

(12) United States Patent
Lin et al.

(10) Patent No.: US 12,782,392 B2
(45) Date of Patent: Nov. 3, 2026

(54) PROBE CARDS, DUT SIDE MODULES OF THE PROBE CARDS, TESTING METHODS AND SYSTEMS THAT INCLUDE THE PROBE CARDS, TESTED DEVICES AND METHODS OF PRODUCING TESTED DEVICES BY UTILIZING THE PROBE CARDS

(71) Applicant: MPI CORPORATION, Chu-Pei City (TW)

(72) Inventors: Chin-Yi Lin, Chu-Pei City (TW); Che-Wei Lin, Chu-Pei City (TW); Hsueh-Chih Wu, Chu-Pei City (TW); Tsung-Yi Chen, Chu-Pei City (TW); Shang-Jung Hsieh, Chu-Pei City (TW); Sheng-Yu Lin, Chu-Pei City (TW); Chien-Kai Hung, Chu-Pei City (TW); Sheng-Wei Lin, Chu-Pei City (TW); Shu-Jui Chang, Chu-Pei City (TW)

(73) Assignee: MPI CORPORATION, Chu-Pei City (TW)

( * ) Notice: Subject to any disclaimer, the term of this patent is extended or adjusted under 35 U.S.C. 154(b) by 98 days.

(21) Appl. No.: 18/409,008

(22) Filed: Jan. 10, 2024

(65) Prior Publication Data

US 2024/0241155 A1 Jul. 18, 2024

(30) Foreign Application Priority Data

Jan. 13, 2023 (TW) ................................ 112101613

(51) Int. Cl.

| | |
|---|---|
| ***G01R 1/073*** | (2006.01) |
| ***G01R 1/02*** | (2006.01) |
| ***G01R 1/04*** | (2006.01) |
| ***G01R 1/067*** | (2006.01) |
| ***G01R 3/00*** | (2006.01) |
| ***G01R 27/00*** | (2006.01) |

(Continued)

(52) U.S. Cl.
CPC ..... *G01R 1/07342* (2013.01); *G01R 31/2889* (2013.01)

(58) Field of Classification Search
CPC . G01R 1/02; G01R 1/04; G01R 1/067; G01R 1/073; G01R 31/00; G01R 31/02;
(Continued)

(56) References Cited

U.S. PATENT DOCUMENTS 6,677,771 B2 * 1/2004 Zhou .................. G01R 1/07314 324/750.25
8,723,545 B2 5/2014 Lee et al.
(Continued)

FOREIGN PATENT DOCUMENTS

CN 101111774 A 1/2008
CN 107533100 A 1/2018
(Continued)

*Primary Examiner* — Neel D Shah
(74) *Attorney, Agent, or Firm* — Birch, Stewart, Kolasch & Birch, LLP

(57) ABSTRACT

A probe card includes a structure stiffener unit including a base with a lower surface where central and peripheral supporting elements protrude out and a main circuit board is fixed, a space transformer and a probe head disposed thereunder, which are disposed to the supporting elements by bolts and defined with central and peripheral regions located correspondingly to the central and peripheral supporting elements respectively, and a metal supporting member fixed on the space transformer in a direct contact manner and located correspondingly to the central region. The supporting member has a lower surface coplanar with the lower end surface of the peripheral supporting element, which is abutted on the space transformer, and an upper surface against which the central supporting element is abutted. The space transformer has great structural strength, flatness and heat
(Continued)

dissipation effect for satisfying the large-area requirement and great electrical property testing stability.

13 Claims, 10 Drawing Sheets

(51) Int. Cl.

| | |
|---|---|
| ***G01R 31/02*** | (2006.01) |
| ***G01R 31/26*** | (2020.01) |
| ***G01R 31/28*** | (2006.01) |

(58) Field of Classification Search

CPC .......... G01R 31/26; G01R 31/28; G01R 3/00; G01R 27/00

See application file for complete search history.

(56) References Cited

U.S. PATENT DOCUMENTS

| | | | | |
|---|---|---|---|---|
| 9,581,639 | B2 | 2/2017 | Yang et al. | |
| 11,761,984 | B2 * | 9/2023 | Lou | G01R 31/2889 324/754.07 |
| 2009/0212797 | A1 | 8/2009 | Lee | |
| 2010/0176831 | A1 * | 7/2010 | Palcisko | G01R 1/07357 324/756.03 |
| 2014/0091826 | A1 * | 4/2014 | Chui | G01R 1/07378 324/756.03 |
| 2020/0057095 | A1 | 2/2020 | Liberin | |
| 2020/0182907 | A1 | 6/2020 | Ito | |
| 2022/0099703 | A1 | 3/2022 | Liberini | |

FOREIGN PATENT DOCUMENTS

| | | | | |
|---|---|---|---|---|
| CN | 112394205 | A | 2/2021 | |
| JP | 6275567 | B2 | 2/2018 | |
| TW | M392351 | U1 | 11/2010 | |
| TW | 201111799 | A1 | 4/2011 | |
| TW | M499560 | U | 4/2015 | |
| TW | 201534928 | A | 9/2015 | |
| TW | 201708825 | A | 3/2017 | |
| TW | 202229883 | A | 8/2022 | |
| WO | WO-2015132748 | A1 * | 9/2015 | G01R 1/07378 |

* cited by examiner

PROBE CARDS, DUT SIDE MODULES OF THE PROBE CARDS, TESTING METHODS AND SYSTEMS THAT INCLUDE THE PROBE CARDS, TESTED DEVICES AND METHODS OF PRODUCING TESTED DEVICES BY UTILIZING THE PROBE CARDS

BACKGROUND OF THE INVENTION

1. Field of the Invention

The present invention relates generally to probe cards and more particularly, to a large-area probe card, a DUT side module of the probe card, a testing method, a method of producing a tested device and a testing system, wherein the probe card is utilized, and the tested device.

2. Description of the Related Art

Referring to FIG. 1, the conventional probe card 10 primarily includes a main circuit board 11, a space transformer 12 connected with the main circuit board 11, and a probe head 13 connected with the space transformer 12. The main circuit board 11 is adapted to be electrically connected to a tester (not shown). The probe head 13 includes a plurality of probes 14. The probes 14 are adapted to contact a device under test (also referred to as "DUT" hereinafter) 15, such as a die on a wafer, making the device under test 15 electrically connected with the tester through the probes 14, inner circuits of the space transformer 12 and inner circuits of the main circuit board 11 in order. In other words, the probe card 10 is a transmission interface for transmitting test signals between the tester and the device under test 15.

Wherein the space transformer (also referred to as ST hereinafter) 12 is a multi-layer laminated circuit board, such as multi-layer organic substrate (also referred to as MLO hereinafter) or multi-layer ceramic substrate (also referred to as MLC hereinafter). The device under test 15 is provided thereon with electrically conductive contacts having very small intervals therebetween. The corresponding probes 14 also have very small intervals therebetween. Therefore, the distances between the signal transmitting paths need to be widened through the inner circuits of the space transformer 12, which is the so-called space transforming, in a way that the intervals between the electrically conductive contacts located on the top surface of the space transformer 12 are larger than the intervals between the electrically conductive contacts located on the bottom surface of the space transformer 12. The intervals between the electrically conductive contacts located on the bottom surface of the space transformer 12 equal to the intervals between the probes 14. In this way, the electrically conductive contacts located on the top surface of the space transformer 12 can be connected to the electrically conductive contacts located on the bottom surface of the main circuit board 11, enabling the circuits in the device under test 15 to be electrically connected with the main circuit board 11.

In order to raise the test efficiency so as to reduce the test cost, some probe cards are configured with the structure capable of testing a plurality of DUTs at the same time, which means the probe card should be provided with relatively more probes for correspondingly probing more DUTs at the same time. Therefore, the probe head and the space transformer associated to the probe head should be provided with increased areas correspondingly. However, the large-area space transformer is liable to have the problems of low structural strength and the resulting ease of being deformed by the received force, and low flatness thereof. Specifically speaking, the space transformer is highly demanded in flatness thereof. For example, the difference of ±100 μm may affect the accuracy of the probes as a whole. Therefore, the increase of the area of the space transformer brings more stringency to the flatness thereof. Particularly, compared with MLC. MLO has the advantages of better electrical properties and lower cost, but MLO is softer in material, resulting in the problem of unease in control of its flatness under the large-area condition. Besides, the large-area space transformer tests relatively more DUTs, so as to receive relatively more heat resulted from the electrical signal transmission by its inner circuits and heat conducted by the probes, thereby liable to have the problem of heat deformation. The aforementioned problems of low structural strength, low flatness and/or heat deformation of the space transformer will cause that in micro-observation, the plurality of probes virtually have height differences of several micrometers to tens of micrometers therebetween. When the surface electrical contact between the probes and contacts (e.g. PAD or Bump) of the device under test is in process or a certain overdrive (also referred to as OD hereinafter) is provided for the electrical connection, the height differences between the probes cause different conditions to the contact between the probes and the contacts of the device under test, which will affect the stability of the probes contacting the device under test, resulting in unstable electrical property test results.

SUMMARY OF THE INVENTION

The present invention has been accomplished in view of the above-noted circumstances. It is an objective of the present invention to provide a probe card and a DUT side module of the probe card, which can cause the space transformer great structural strength, flatness and heat dissipation effect, so as to satisfy the large-area space transformer requirement and also have great stability in electrical property test.

To attain the above objective, the present invention provides a probe card which includes a probe head, a space transformer, a supporting member, a main circuit board unit, a structure stiffener unit, and a plurality of bolts. The probe head includes a probe seat, and a plurality of probes disposed to the probe seat. The probe head is defined with a central region including the plurality of probes, and a peripheral region located on the periphery of the central region. The space transformer includes an upper surface and a lower surface, which face toward opposite directions. The probe seat is attached to the lower surface of the space transformer. The probes are electrically connected with the space transformer. The supporting member is made of metal, and includes an upper surface and a lower surface, which face toward opposite directions. The lower surface of the supporting member is disposed to the upper surface of the space transformer in a direct contact manner, and located correspondingly to the central region. The main circuit board unit includes a main circuit board. The main circuit board includes an upper surface and a lower surface, which face toward opposite directions. The structure stiffener unit includes a base and a plurality of supporting elements. Each supporting element protrudes out of a lower surface of the base. The plurality of supporting elements include at least one central supporting element located correspondingly to the central region, and at least one peripheral supporting element located correspondingly to the peripheral region.

The upper surface of the main circuit board is disposed to the lower surface of the base. The central supporting element and the peripheral supporting element are inserted in the main circuit board unit. A lower end surface of the peripheral supporting element is lower in position of height than the lower surface of the main circuit board. The lower end surface of the peripheral supporting element is abutted against the upper surface of the space transformer, and coplanar with the lower surface of the supporting member, so that the lower surface of the main circuit board and the upper surface of the space transformer have a distance therebetween. The central supporting element is abutted against the upper surface of the supporting member. The bolts are inserted through the probe head and the space transformer, and fixedly screwed into the supporting elements of the structure stiffener unit.

Wherein the probe seat is attached to the lower surface of the space transformer. The lower surface of the supporting member is disposed to the upper surface of the space transformer, and located correspondingly to the central region. The peripheral supporting element of the structure stiffener unit is abutted against the upper surface of the space transformer, and coplanar with the lower surface of the supporting member. The central supporting element is abutted against the upper surface of the supporting member. The plurality of bolts are inserted through the probe head and the space transformer, and fixedly screwed into the supporting elements of the structure stiffener unit. In this way, the peripheral supporting element of the structure stiffener unit is abutted against the upper surface of the space transformer, so that the structure stiffener unit and the probe head collectively clamp the space transformer. Besides, the central supporting element of the structure stiffener unit is abutted against the upper surface of the supporting member, so that the structure stiffener unit, the supporting member and the probe head collectively clamp the space transformer. In addition, the peripheral supporting element of the structure stiffener unit is coplanar with the lower surface of the supporting member. As a result, a sandwich structure of the probe head and the structure stiffener unit collectively clamping the space transformer is formed, enabling the space transformer to satisfy the large-area requirement and still have great flatness.

Furthermore, the lower surface of the supporting member is disposed to the upper surface of the space transformer in a direct contact manner and located correspondingly to the central region. The central supporting element is abutted against the upper surface of the supporting member. As a result, great support is provided to the space transformer, especially the part of the space transformer corresponding in position to the central region of the probe head provided with the plurality of probes, so as to prevent the space transformer from the deformation problem caused by low structural strength due to the large-area requirement. Besides, the central supporting element and the peripheral supporting element are inserted in the main circuit board unit. The lower end surface of the peripheral supporting element is lower in position of height than the lower surface of the main circuit board, so that the lower surface of the main circuit board and the upper surface of the space transformer have a distance therebetween. As a result, the above-described supporting effect of the supporting element and the supporting member to the space transformer also makes the upper surface of the space transformer and the lower surface of the main circuit board have the distance therebetween, such that a suspended structure of the space transformer being suspended from the main circuit board unit is formed, capable of preventing the deformation of the main circuit board from affecting the flatness of the space transformer. In addition, the supporting member is made of metal, and the lower surface of the supporting member is disposed to the upper surface of the space transformer in a direct contact manner and located correspondingly to the central region. As a result, the material of the supporting member is metal, having great rigidity and heat conduction effect, and the supporting member is located correspondingly to the central region of the probe head, not only causing the space transformer great flatness, but also attaining great heat dissipation effect in dissipating the heat conducted by the probes and the heat resulted from the electrical signal transmission by the inner circuits of the space transformer. Furthermore, the supporting member and the space transformer are fastened to each other, thereby prevented from relative movement, not only beneficial for the flatness of the space transformer, but also preventing the space transformer from wear. In this way, the probe card of the present invention can satisfy the large-area space transformer requirement and also ensure great stability in electrical property test, so as to attain that the test efficiency is improved in a way that a plurality of DUTs are tested at the same time by a large-area probe card having great stability in electrical property test.

Preferably, the supporting member may be hollow in shape and have at least one hollow space. For example, the supporting member may be hollow-square-shaped, hollow-grid-shaped, radially shaped, and so on. When the probe card needs to be provided with the supporting member with a relatively larger area, the above-described hollow shaped supporting member is material-saving, having reduced weight, and can still improve the structural strength and flatness of the space transformer and bring great heat dissipation effect.

More preferably, the probe card may further include at least one electronic component. The electronic component is attached to the upper surface of the space transformer and located in the hollow space of the supporting member. As a result, the electronic component, which is required to be disposed on the main circuit board formerly, can be changed to be attached to the space transformer, so that the position of height of the electronic component is relatively closer to the device under test. Besides, the supporting member is located correspondingly to the central region of the probe head, and the central region is where the probes are disposed. Therefore, locating the electronic component in the hollow space of the supporting member also makes the horizontal position of the electronic component close to the device under test. In this way, the electronic component and the device under test have a shortened signal transmitting path therebetween.

Preferably, the space transformer may be a multi-layer ceramic substrate. The upper surface of the space transformer has an installation section located on the periphery of the supporting member and located correspondingly to the central region. The installation section is adapted to be disposed with at least one electronic component. The multi-layer ceramic substrate has a great hardness, so the small-area supporting member can be adopted to improve the structural strength, flatness and heat dissipation effect of the space transformer, such that the part of the upper surface of the space transformer corresponding in position to the central region is not only provided with the supporting member but also has the aforementioned installation section. Therefore, even though the supporting member has no hollow space, the electronic component can be still arranged in the aforementioned installation section for the shortened signal transmitting path between the electronic component and the device under test.

Preferably, the space transformer may be a multi-layer organic substrate. The supporting member is located correspondingly to all the probes. The supporting member is hollow in shape and has at least one hollow space. The multi-layer organic substrate has a lower hardness, so the large-area supporting member can be adopted, such that the supporting member is located correspondingly to all the probes, which means the supporting member approximately corresponds in position to the whole central region, so as to improve the structural strength, flatness and heat dissipation effect of the space transformer, and the space transformer has the multi-layer organic substrate's advantages of great electrical properties and low cost. Besides, the hollow shaped supporting member is material-saving, has reduced weight, and adapted for the electronic component to be placed in the hollow space for the shortened signal transmitting path between the electronic component and the device under test.

Preferably, the supporting member may have a plurality of heat dissipation fins protruding from the upper surface of the supporting member for further improving the heat dissipation effect.

Preferably, the supporting member is fixed to the space transformer by welding. The probe card further includes a plurality of fasteners. The space transformer and the probe seat are fastened to each other by the fasteners, so that the probe head, the space transformer, the supporting member and the fasteners compose a DUT side module. As a result, the probe head, the space transformer and the supporting member are modularized for being detached from the structure stiffener unit and installed thereon, having the advantages of convenience for detachment and installation and convenience for maintenance.

The present invention further provides a DUT side module of a probe card, which includes a probe head, a space transformer, a supporting member, and a plurality of fasteners. The probe head includes a probe seat, and a plurality of probes disposed to the probe seat. The probe head is defined with a central region including the plurality of probes, and a peripheral region located on the periphery of the central region. The space transformer includes an upper surface and a lower surface, which face toward opposite directions. The probe seat is attached to the lower surface of the space transformer. The probes are electrically connected with the space transformer. The supporting member is made of metal. The supporting member is fixed to the upper surface of the space transformer by welding in a direct contact manner and located correspondingly to the central region. The space transformer and the probe seat are fastened to each other by the fasteners.

As a result, for the large-area space transformer which may have low flatness problem, especially MLO, the supporting member being fixed to the space transformer by welding in a direct contact manner causes that when the space transformer has not been connected with any component other than the supporting member yet, the flatness of the space transformer has been improved by the supporting member. Particularly, the supporting member is located correspondingly to the central region, which means the supporting member is approximately fixed to a central section of the space transformer, which is even more effective in improving the flatness. Besides, the space transformer and the probe seat are fastened to each other by the fasteners, so that the probe head, the space transformer, the supporting member and the fastener compose a DUT side module. As a result, the probe head, the space transformer and the supporting member are modularized for being detached from the structure stiffener unit and installed thereon, having the advantages of convenience for detachment and installation and convenience for maintenance.

The present invention further provides a testing method for testing a device under test. The device under test is formed on a substrate. The device under test includes at least one contact. The testing method includes the steps of providing the aforementioned probe card, electrically connecting the probe card with the device under test by making the probe of the probe card in contact with the contact of the device under test, and testing the device under test by using the probe card to transmit a signal between the device under test and a tester.

The present invention further provides a method of producing a tested device, which includes the steps of providing the aforementioned probe card, providing a device under test formed on a substrate and including at least one contact, electrically connecting the probe card with the device under test by making the probe of the probe card in contact with the contact of the device under test, and testing the device under test by using the probe card to transmit a signal between the device under test and a tester.

The present invention further provides a tested device. The tested device is tested by a testing process. The testing process is performed by using the aforementioned probe card.

The present invention further provides a testing system for testing a device under test formed on a substrate. The device under test includes at least one contact. The testing system includes a chuck configured to support the substrate, the aforementioned probe card, and a signal generator and a signal analyzer, which are electrically connected with the probe card. The probe card is configured to be electrically connected with the device under test in a way that the probe of the probe card is in contact with the contact of the device under test. The signal generator is configured to generate a test signal for the probe card to transmit the test signal to the device under test. The signal analyzer is configured to receive a resultant signal through the probe card and analyze the resultant signal.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
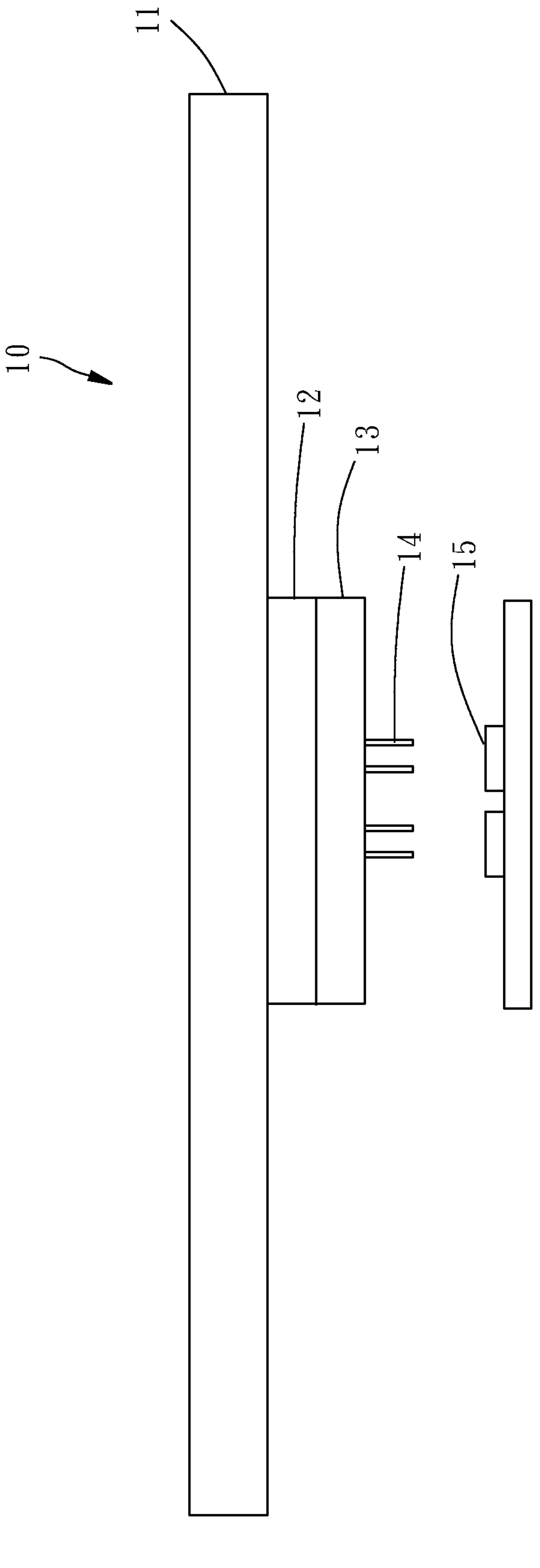
FIG. 1 PRIOR ART
FIG. 1 is a schematic view of a conventional probe card.

First of all, it is to be mentioned that same or similar reference numerals used in the following embodiments and the appendix drawings designate same or similar elements or the structural features thereof throughout the specification for the purpose of concise illustration of the present invention. It should be noticed that for the convenience of illustration, the components and the structure shown in the figures are not drawn according to the real scale and amount, and the features mentioned in each embodiment can be applied in the other embodiments if the application is possible in practice. Besides, when it is mentioned that an element is disposed on another element, it means that the former element is directly disposed on the latter element, or the former element is indirectly disposed on the latter element through one or more other elements between aforesaid former and latter elements. When it is mentioned that an element is directly disposed on another element, it means that no other element is disposed between aforesaid former and latter elements.

Figure 2:
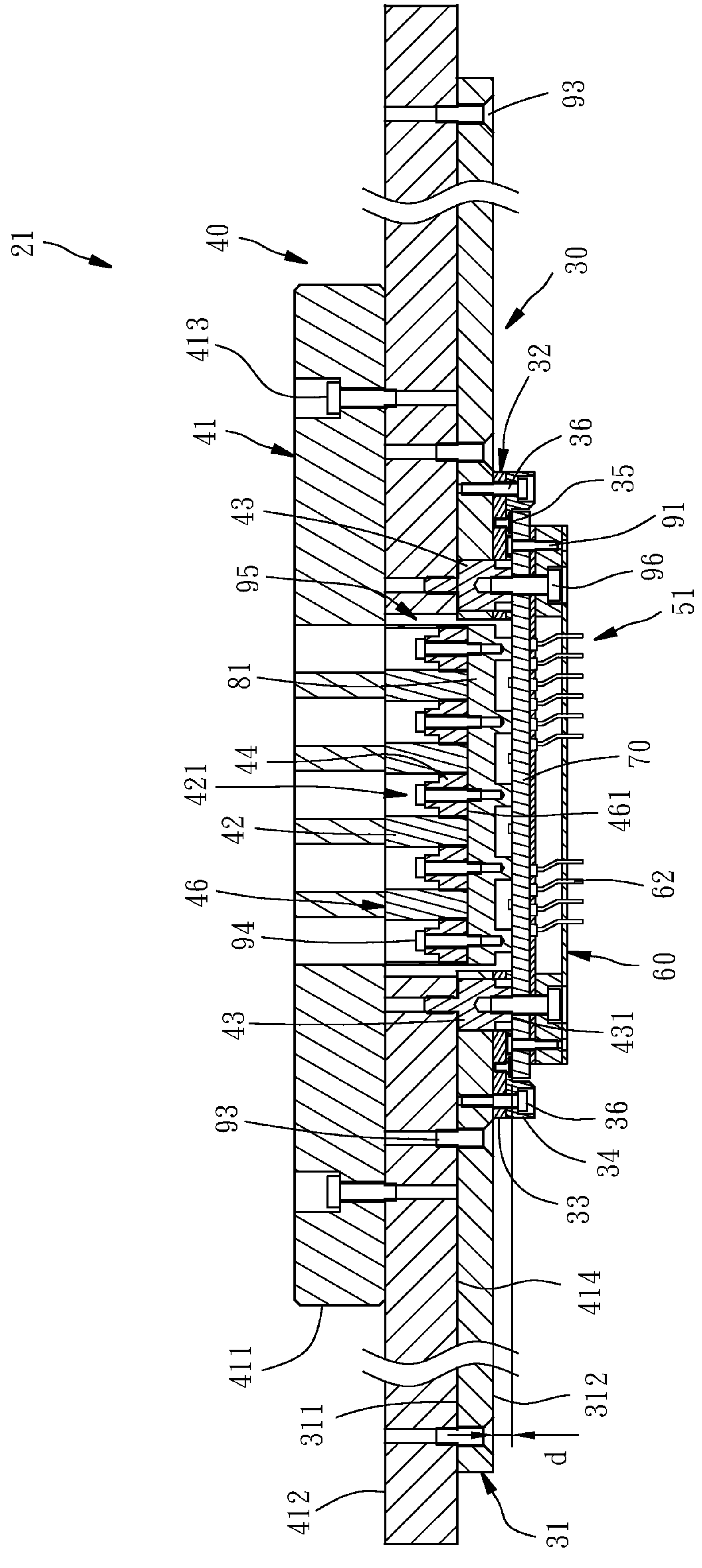
FIG. 2 is a sectional view of a probe card according to a first preferred embodiment of the present invention.
Figure 3:
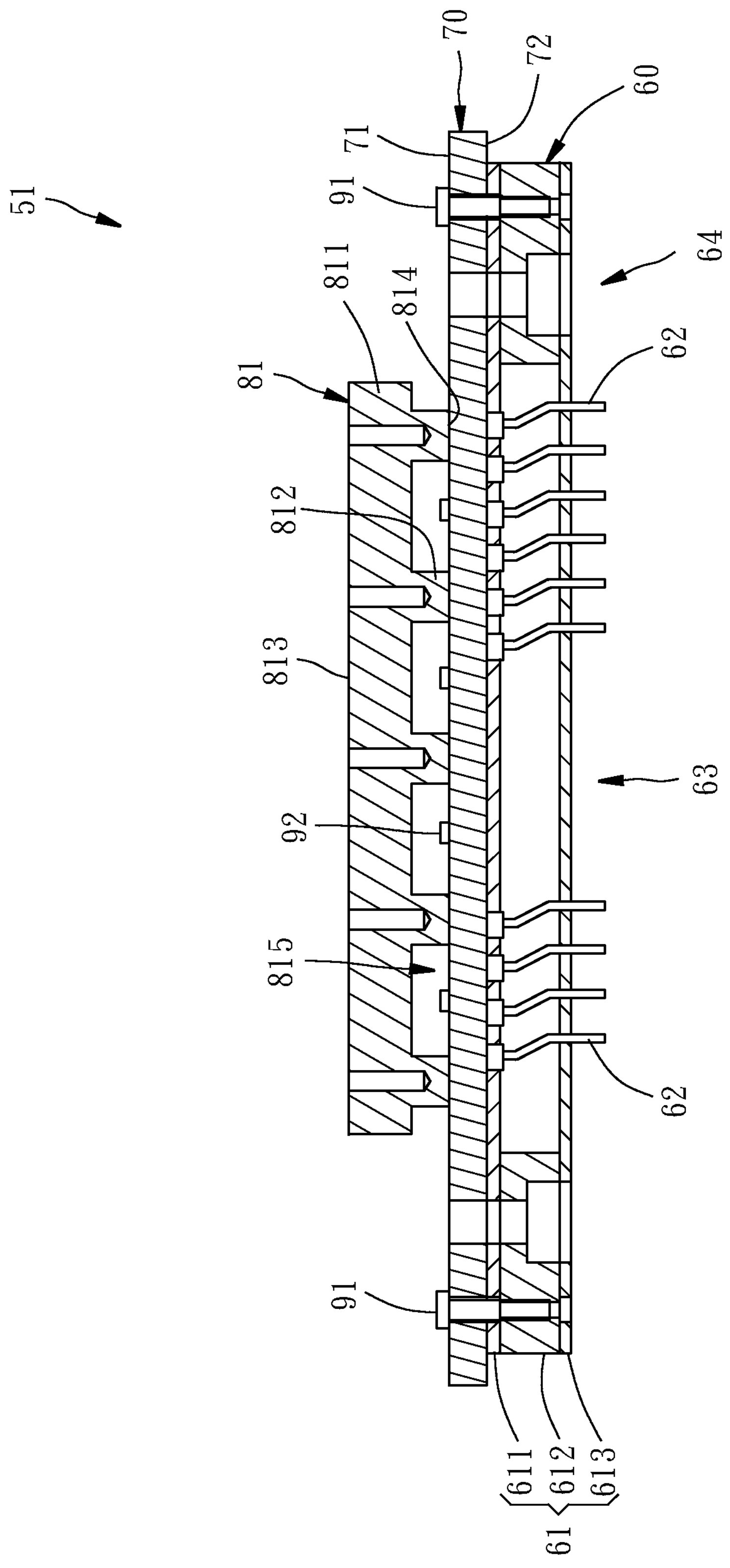
FIG. 3 is a sectional view of a DUT side module of the probe card according to the first preferred embodiment of the present invention.

Referring to FIG. 2, a probe card 21 according to a first preferred embodiment of the present invention primarily includes a main circuit board unit 30, a structure stiffener unit 40, and a DUT side module 51, i.e. a module facing the DUT when the probe card 21 is in use. Referring to FIG. 3, the DUT side module 51 in this embodiment includes a probe head 60, a space transformer 70, a supporting member 81, and a plurality of fasteners 91. In this embodiment, the fasteners 91 are bolts. Besides, as shown in FIG. 2, the probe card 21 further includes a plurality of bolts for fastening different components to each other, which will be specified hereinafter.

Figure 14:
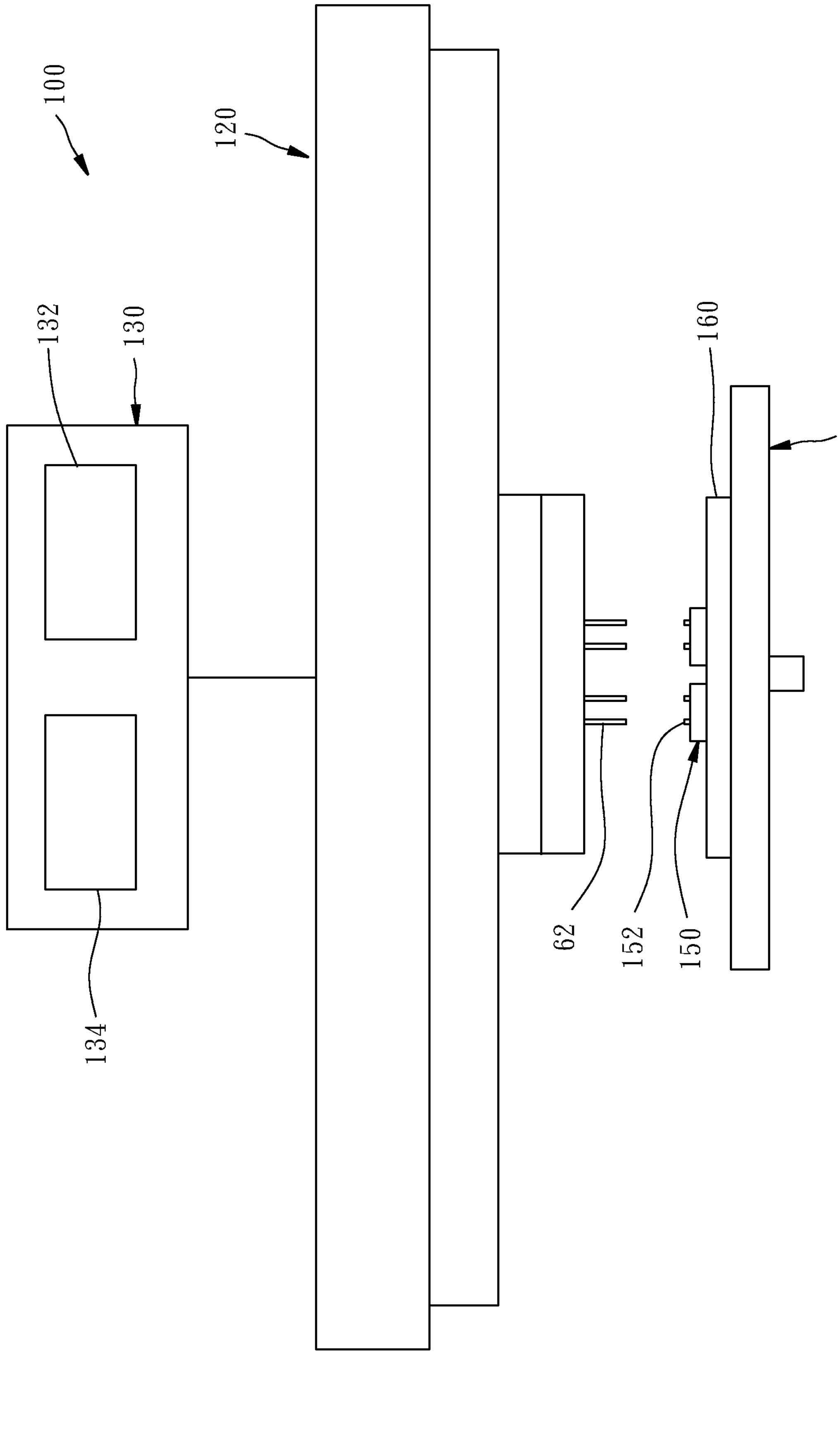
FIG. 14 is a schematic view of a testing system of the present invention and a device under test.

As shown in FIG. 3, the probe head 60 includes a probe seat 61, and a plurality of probes 62 disposed to the probe seat 61. The probe seat 61 in this embodiment is composed of an upper die 611, a middle die 612 and a lower die 613, which are piled on one another, but the probe seat 61 in the present invention is unlimited thereto. For example, the upper die 611, the middle die 612 or the lower die 613 may be composed of a plurality of boards. The probes 62 are inserted through the upper, middle and lower dies 611-613. The lower ends of the probes 62 are located below the lower die 613 for the contact with a device under test 150 as shown in FIG. 14. The probe head 60 is defined with a central region 63 including all the probes 62, and a peripheral region 64 located on the periphery of the central region 63. In this embodiment, the central region 63 refers to the area extending from the center of the probe head 60 toward the periphery thereof and provided with the probes 62 for testing electrical properties of the device under test, and the peripheral region 64 is the area further extending toward the periphery of the probe head 60 relative to the central region 63. When the contact between the probes 62 and the surfaces of the contacts (e.g. PAD or Bump) of the device under test or the providing of a certain overdrive for the electrical connection therebetween is carried out, the central region 63 is the region bearing the force in the direction from the DUT side. In other words, the force is transmitted from the DUT side upwardly. The central region 63 corresponds in position to the space transformer 70 excluding the region thereof for disposing a connecting board 32 (described hereinafter).

The space transformer 70 is a circuit board, including an upper surface 71 and a lower surface 72, which face toward opposite directions, a plurality of upper electrically conductive contacts (not shown) located on the upper surface 71, a plurality of lower electrically conductive contacts (not shown) located on the lower surface 72, and a plurality of inner circuits (not shown) electrically connecting the upper electrically conductive contacts with the lower electrically conductive contacts. The probe seat 61 is attached to the lower surface 72 of the space transformer 70. The fasteners 91 are inserted through the space transformer 70 and fixedly screwed into the probe seat 61, making the space transformer 70 and the probe seat 61 detachably fastened to each other. By the inner circuits of the space transformer 70, the upper electrically conductive contacts are provided differently in position and/or pitch from the lower electrically conductive contacts. For example, the aforementioned upper electrically conductive contacts of the space transformer 70 are located correspondingly to the peripheral region 64 of the probe head 60, but the aforementioned lower electrically conductive contacts of the space transformer 70 are located correspondingly to the central region 63 of the probe head 60, and the probes 62 are electrically connected with the lower electrically conductive contacts of the space transformer 70 respectively. In this embodiment, the space transformer 70 is a multi-layer stacked circuit board. According to the material and/or structure thereof, the space transformer 70 may be, for example, a multi-layer organic substrate (also referred to as MLO hereinafter) or a multi-layer ceramic substrate (also referred to as MLC hereinafter).

The supporting member 81 is made of metal. The supporting member 81 is fixed to the upper surface 71 of the space transformer 70 by welding in a direct contact manner, and located correspondingly to the central region 63 of the probe head 60. The supporting member 81 in this embodiment includes a base portion 811, and a plurality of supporting portions 812 extending from the bottom surface of the base portion 811. The top surface of the base portion 811 is the upper surface 813 of the supporting member 81. The bottom surfaces of the supporting portions 812 are the lower surface 814 of the supporting member 81. The bottom surfaces of all the supporting portions 812 are fixed to welding pads (not shown) formed on the upper surface 71 of the space transformer 70 by welding. When being viewed from the lateral surface, the supporting member 81 is hollow in shape in the vertical direction, thereby having a hollow space 815 between every two adjacent supporting portions 812. Each hollow space 815 accommodates an electronic component 92. The electronic component 92 is attached to the upper surface 71 of the space transformer 70, thereby electrically connected with the device under test through the space transformer 70 and the probe 62. In this embodiment, there may be a plurality of electronic components 92. In other words, each hollow space 815 may accommodate a plurality of electronic components 92, or each hollow space 815 may accommodate an electronic component 92 and a plurality of hollow spaces 815 accommodate a plurality of electronic components 92 in total.

As shown in FIG. 2, the main circuit board unit 30 primarily includes a main circuit board 31, and a connecting board 32. The connecting board 32 in this embodiment includes an upper plate 33, a lower plate 34, and a plurality of bolts 35 fastening the upper plate 33 with the lower plate 34. However, the connecting board 32 may be made integrally. The main circuit board 31 includes an upper surface 311 and a lower surface 312, which face toward opposite directions. The connecting board 32 is attached to the lower surface 312 of the main circuit board 31. A plurality of bolts 36 are inserted through the connecting board 32 and fixedly screwed into the main circuit board 31, making the main circuit board 31 and the connecting board 32 detachably fastened to each other. The inside of the connecting board 32 is adapted to accommodate a plurality of elastic contact members (not shown) for the aforementioned upper electrically conductive contacts of the space transformer 70 to be electrically connected with the main circuit board 31 through the elastic contact members.

The structure stiffener unit 40 in this embodiment primarily includes a base 41, and a plurality of supporting elements which may be realized as, but not limited to, pillars, columns, or blocks in the present invention. The plurality of supporting elements include a plurality of peripheral supporting elements 43, and a central supporting element 46. In this embodiment, the base 41 includes an upper plate 411, a lower plate 412, and a plurality of bolts 413 fastening the upper plate 411 with the lower plate 412. However, the base 41 may be made integrally. The whole structure stiffener unit 40 may be even made integrally. A plurality of bolts 93 are inserted through the main circuit board 31 and fixedly screwed into the lower plate 412, making the upper surface 311 of the main circuit board 31 detachably disposed to a lower surface 414 of the base 41. The lower surface 414 of the base 41 is also the lower surface of the lower plate 412. Each peripheral supporting element 43 is a steel column, which is inserted through the connecting board 32 and the main circuit board 31 and fixedly screwed into the lower plate 412 of the base 41. The central supporting element 46 includes an installation block 42 and a plurality of columns 44. Each column 44 is a steel column. The installation block 42 has a plurality of through holes 421. The columns 44 are fixedly screwed into the through holes 421 respectively.

To combine the DUT side module 51 with the main circuit board unit 30 and the structure stiffener unit 40, at first, the upper plate 411 of the base 41 is separated from the lower plate 412. The lower plate 412 of the base 41 and the main circuit board unit 30 are each provided at the center thereof with a through hole, and these through holes collectively form an accommodating space 95. The DUT side module 51 is firstly disposed on the bottom of the main circuit board unit 30 in a way that the supporting member 81 is located in the accommodating space 95 and the peripheral supporting elements 43 are located correspondingly to the peripheral region 64 of the probe head 60. A lower end surface 431 of the peripheral supporting element 43 is lower in position of height than the lower surface 312 of the main circuit board 31. In other words, the position of height of the lower end surface 431 of the peripheral supporting element 43 is located out of and below the lower surface 312 of the main circuit board 31. The lower end surfaces 431 of the peripheral supporting elements 43 are abutted against the upper surface 71 of the space transformer 70, and coplanar with the lower surface 814 of the supporting member 81. After that, a plurality of bolts 96 are inserted through the peripheral region 64 of the probe head 60 and the space transformer 70 and fixedly screwed into the peripheral supporting elements 43 respectively, making the DUT side module 51 detachably disposed to the structure stiffener unit 40. After that, the central supporting element 46 is placed into the accommodating space 95 in a way that a lower end surface 461 of the central supporting element 46 is abutted against the upper surface 813 of the supporting member 81, and then a plurality of bolts 94 are inserted through the columns 44 respectively and fixedly screwed into the supporting member 81, making the central supporting element 46 and the supporting member 81 detachably fastened to each other. At last, the upper plate 411 of the base 41 is fastened to the lower plate 412 by the bolts 413, making the installation block 42 abutted against the upper plate 411 of the base 41, such that the assembly of the probe card 21 is accomplished. The central supporting element 46 and the peripheral supporting elements 43 all protrude out of the lower surface 414 of the base 41 and inserted in the main circuit board unit 30. The lower end surface 461 of the central supporting element 46 is slightly lower in position of height than the upper surface 311 of the main circuit board 31, and the central supporting element 46 is located correspondingly to the central region 63 of the probe head 60.

It is to be mentioned that each peripheral supporting element 43 in this embodiment includes only a column. The lower end surface 431 of the peripheral supporting element 43 is the lower end surface of the column. However, each peripheral supporting element 43 may further include a spacer (not shown) disposed between the lower end surface of the column and the space transformer 70, so that the lower end surface 431 of the peripheral supporting element 43 is the lower surface of the spacer. Likewise, the central supporting element 46 may further include a spacer (not shown) disposed between the supporting member 81 and the columns 44 and the installation block 42, so that the lower end surface 461 of the central supporting element 46 is the lower surface of the spacer.

The probe seat 61 is attached to the lower surface 72 of the space transformer 70, the lower surface 814 of the supporting member 81 is disposed to the upper surface 71 of the space transformer 70 and located correspondingly to the central region 63, the central supporting element 46 is abutted against the upper surface 811 of the supporting member 81, the lower end surfaces 431 of the peripheral supporting elements 43 are abutted against the upper surface 71 of the space transformer 70 and coplanar with the lower surface 814 of the supporting member 81, and the bolts 96 are inserted through the probe head 60 and the space transformer 70 and fixedly screwed into the supporting elements 43 of the structure stiffener unit 40. In this way, the peripheral supporting elements 43 and the probe head 60 collectively clamp the space transformer 70. Through the supporting member 81, the central supporting element 46 and the probe head 60 collectively clamp the space transformer 70. Besides, the lower end surfaces 431 of the peripheral supporting elements 43 are coplanar with the lower surface 814 of the supporting member 81. As a result, a sandwich structure of the probe head 60 and the structure stiffener unit 40 collectively clamping the space transformer 70 is formed, and the clamping position corresponds in position to the central region 63 and corresponds in position to the peripheral region 64 as well, bringing the space transformer 70 great flatness even under the large-area requirement. Besides, the lower end surfaces 431 of the peripheral supporting elements 43 are lower in position of height than the lower surface 312 of the main circuit board 31 and abutted against the upper surface 71 of the space transformer 70, making the lower surface 312 of the main circuit board 31 and the upper surface 71 of the space transformer 70 have a distance d therebetween. In this way, the deformation of the main circuit board 31 is prevented from affecting the flatness of the space transformer 70. Further specifically speaking, the upper surface 71 of the space transformer 70 and the lower plate 34 of the connecting board 32 have a tiny distance therebetween. By the tiny distance, when the connecting board 32 disposed to the main circuit board 31 is deformed along with the main circuit board 31, it is also prevented from affecting the flatness of the space transformer 70.

In addition, the lower surface 814 of the supporting member 81 is disposed to the upper surface 71 of the space transformer 70 in a direct contact manner and located correspondingly to the central region 63, and the central supporting element 46 is abutted against the upper surface 813 of the supporting member 81. In this way, great support is provided to the space transformer 70, especially the central section of the space transformer 70. The central section of the space transformer 70 refers to the section corresponding in position to the central region 63 of the probe head 60. As a result, the space transformer 70 is prevented from the deformation problem caused by the low structural strength under the large-area requirement.

Furthermore, the supporting member 81 is made of metal, having great rigidity and heat conduction effect. The lower surface 814 of the supporting member 81 is disposed to the upper surface 71 of the space transformer 70 in a direct contact manner and located correspondingly to the central region 63, not only bringing the space transformer 70 great flatness, but also attaining great heat dissipation effect in dissipating the heat conducted by the probes 62 and the heat resulted from the electrical signal transmission by the inner circuits of the space transformer 70. Besides, the supporting member 81 and the space transformer 70 are fastened to each other and thereby prevented from relative movement, not only beneficial for the flatness of the space transformer 70, but also avoiding that the long-term force receiving of the space transformer 70 and the supporting member 81 causes them deformation and the resulting relative movement so as to cause wear to where they are in contact with each other.

On the other hand, the probe head 60, the space transformer 70 and the supporting member 81 are modularized in the present invention. The DUT side module 51 as shown in FIG. 3 is firstly formed, and then the DUT side module 51 is detachably disposed to the structure stiffener unit 40 by the bolts 96. That brings the advantages of convenience for detachment and installation and convenience for maintenance. Besides, for the large-area space transformer which may have low flatness problem, especially MLO, the supporting member 81 being fixed to the space transformer 70 by welding in a direct contact manner causes that when the space transformer 70 has not been connected with any component other than the supporting member 81 yet, the flatness of the space transformer 70 has been improved by the supporting member 81. Particularly, the supporting member 81 is located correspondingly to the central region 63, which means the supporting member 81 is approximately fixed to the central section of the space transformer 70, which is even more effective in improving the flatness.

As described above, the supporting member 81 in this embodiment has the hollow space 815 for the electronic component 92 to be attached to the upper surface 71 of the space transformer 70 and located in the hollow space 815. As a result, the electronic component, which is required to be disposed on the main circuit board 31 formerly, can be changed to be attached to the space transformer 70, so that the position of height of the electronic component 92 is relatively closer to the device under test. Besides, the supporting member 81 is located correspondingly to the central region 63 of the probe head 60. The central region 63 is where the probes 62 are disposed. Therefore, locating the electronic component 92 in the hollow space 815 of the supporting member 81 also makes the horizontal position of the electronic component 92 close to the device under test. In this way, the electronic component 92 and the device under test have a shortened signal transmitting path therebetween.

Figure 4:
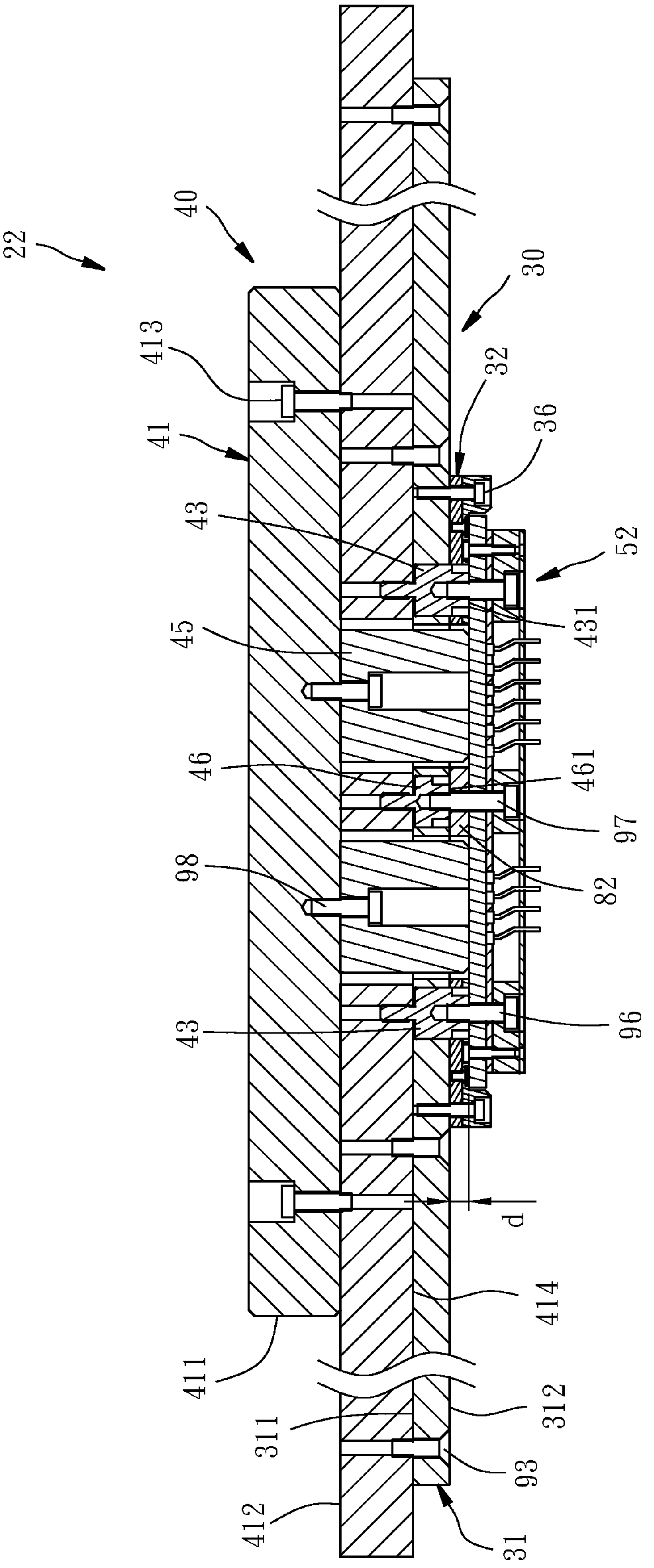
FIG. 4 is a sectional view of a probe card according to a second preferred embodiment of the present invention.
Figure 5:
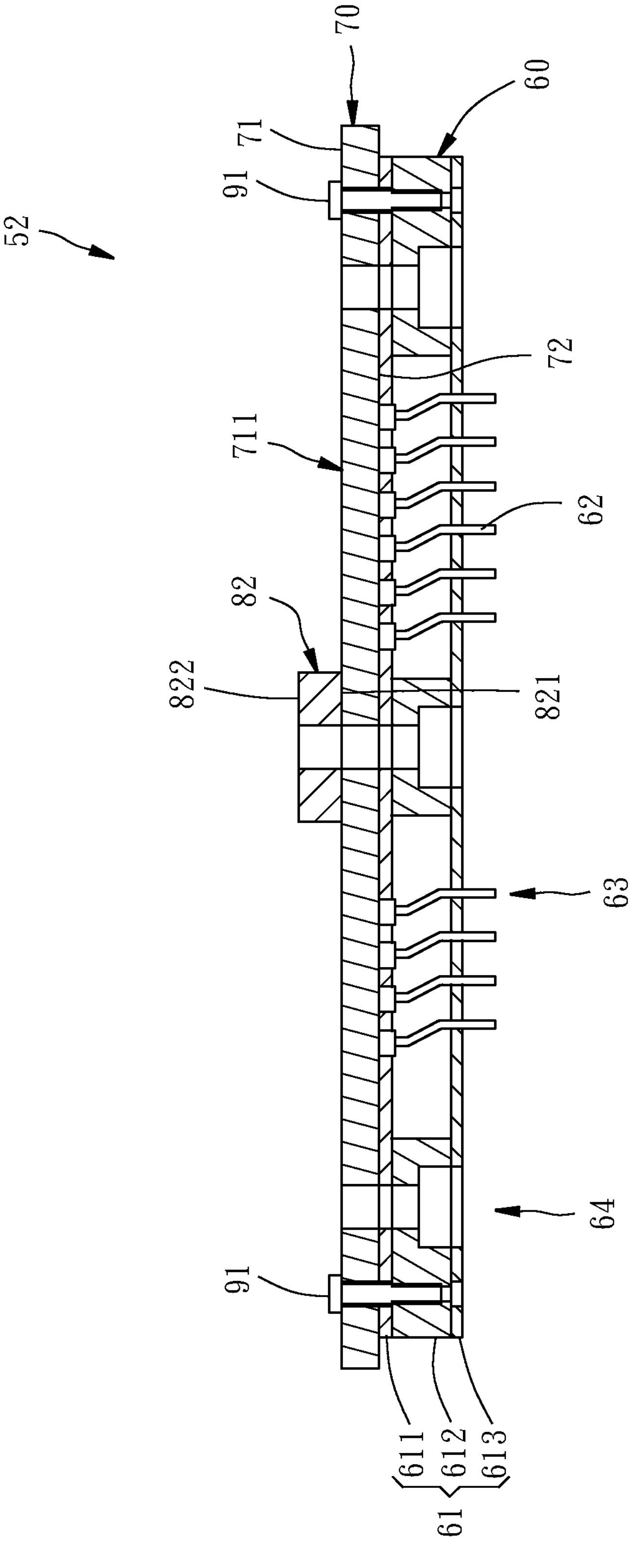
FIG. 5 is a sectional view of a DUT side module of the probe card according to the second preferred embodiment of the present invention.

Referring to FIG. 4 and FIG. 5, a probe card 22 according to a second preferred embodiment of the present invention is similar to the above-described probe card 21 according to the first preferred embodiment, but the primary difference therebetween lies in the supporting member and where other components are connected with the supporting member, which will be specified hereinafter.

As shown in FIG. 5, the DUT side module 52 in this embodiment is similar to the above-described DUT side module 51 in the first preferred embodiment, but the primary difference therebetween is that the supporting member 82 in this embodiment is relatively smaller in size. The lower surface 821 of the supporting member 82 is fixed to only a small area at the center of the upper surface 71 of the space transformer 70 by welding, so that the part of the upper surface 71 of the space transformer 70 located correspondingly to the central region 63 of the probe head 60 is still saved with an installation section 711 located on the periphery of the supporting member 82. The installation section 711 is adapted to be disposed with such electronic component 92 as mentioned in the first preferred embodiment. In this way, even though the supporting member 82 has no hollow space, the electronic component can be still arranged in the installation section 711 for the shortened signal transmitting path between the electronic component and the device under test.

As shown in FIG. 4, the main circuit board unit 30 and the structure stiffener unit 40 in this embodiment are similar to those in the first preferred embodiment. However, for being matched with the small-sized supporting member 82, the central supporting element 46 in this embodiment is only a steel column, like each peripheral supporting element 43. The central supporting element 46 in this embodiment is inserted through the main circuit board 31 and fixedly screwed into the lower plate 412 of the base 41. The lower end surface 461 of the central supporting element 46 is abutted against the upper surface 822 of the supporting member 82 as shown in FIG. 5. The DUT side module 52 in this embodiment is not only detachably disposed to the peripheral supporting elements 43 by the bolts 96, but also detachably disposed to the central supporting element 46 by another bolt 97. The bolt 97 is inserted through the probe seat 61, the space transformer 70 and the supporting member 82, and fixedly screwed into the central supporting element 46.

This embodiment is similar to the first preferred embodiment in that the probe seat 61 is attached to the lower surface 72 of the space transformer 70, the lower surface 821 of the supporting member 82 is disposed to the upper surface 71 of the space transformer 70 and located correspondingly to the central region 63, the central supporting element 46 is abutted against the upper surface 822 of the supporting member 82, the lower end surfaces 431 of the peripheral supporting elements 43 are abutted against the upper surface

71 of the space transformer 70 and coplanar with the lower surface 821 of the supporting member 82, and the bolts 96 and 97 are inserted through the probe head 60 and the space transformer 70 and fixedly screwed into the supporting elements 43 and 46 of the structure stiffener unit 40. Therefore, a sandwich structure of the probe head 60 and the structure stiffener unit 40 collectively clamping the space transformer 70 is also formed in this embodiment, and the clamping position corresponds in position to the central region 63 and corresponds in position to the peripheral region 64 as well, bringing the space transformer 70 great flatness even under the large-area requirement. Besides, the lower end surfaces 431 of the peripheral supporting elements 43 are lower in position of height than the lower surface 312 of the main circuit board 31 and abutted against the upper surface 71 of the space transformer 70, making the lower surface 312 of the main circuit board 31 and the upper surface 71 of the space transformer 70 have a distance d therebetween. In this way, the deformation of the main circuit board 31 is prevented from affecting the flatness of the space transformer 70. Further specifically speaking, the upper surface 71 of the space transformer 70 and the lower plate 34 of the connecting board 32 have a tiny distance therebetween. By the tiny distance, when the connecting board 32 disposed to the main circuit board 31 is deformed along with the main circuit board 31, it is also prevented from affecting the flatness of the space transformer 70.

In addition, the structure stiffener unit 40 in this embodiment further includes a reinforcing block 45. The reinforcing block 45 is inserted through the main circuit board unit 30 and the lower plate 412 of the base 41. A plurality of bolts 98 are inserted through the reinforcing block 45 and fixedly screwed into the upper plate 411 of the base 41. The reinforcing block 45 is abutted against the installation section 711 of the upper surface 71 of the space transformer 70. When the installation section 711 of the upper surface 71 of the space transformer 70 has no such requirement of being provided with the electronic component as described above, or is provided with the electronic component but still has the space for the reinforcing block 45, the reinforcing block 45 can be adopted to further improve the effect of the structure stiffener unit 40 and the probe head 60 collectively clamping the space transformer 70, so as to further improve the flatness of the space transformer 70.

This embodiment is similar to the first preferred embodiment in that the lower surface 821 of the supporting member 82 is disposed to the upper surface 71 of the space transformer 70 in a direct contact manner and located correspondingly to the central region 63, and the central supporting element 46 is abutted against the upper surface 822 of the supporting member 82. Therefore, the space transformer 70 is prevented from the deformation problem resulted from the low structural strength under the large-area requirement. In addition, the supporting member 82 is made of metal, having great rigidity and heat conduction effect, not only beneficial for the flatness of the space transformer 70, but also attaining great heat dissipation effect. Besides, the supporting member 82 and the space transformer 70 are fastened to each other and thereby prevented from relative movement, not only beneficial for the flatness of the space transformer 70, but also preventing the space transformer 70 from wear. Furthermore, the probe head 60, the space transformer 70 and the supporting member 82 are also modularized in this embodiment, bringing the advantages of convenience for detachment and installation and convenience for maintenance, and causing that when the space transformer 70 has not been connected with any component other than the supporting member 82 yet, the flatness of the space transformer 70 is improved by the supporting member 82 beforehand. That is particularly more effective for the section of the space transformer 70 located correspondingly to the central region 63.

For example, in the condition that the space transformer 70 is a multi-laver ceramic substrate (MLC), because MLC is higher in hardness than MLO, the small-area supporting member 82 in the above-described second preferred embodiment can be adopted to improve the structural strength, flatness and heat dissipation effect of the space transformer 70. Comparatively, in the condition that the space transformer 70 is a multi-layer organic substrate (MLO), because MLO is lower in hardness than MLC, the large-area supporting member 81 in the above-described first preferred embodiment can be adopted to improve the structural strength, flatness and heat dissipation effect of the space transformer 70, and the space transformer 70 has the advantages of great electrical properties and low cost of MLO. As shown in FIG. 3, the supporting member 81 is located correspondingly to all the probes 62, which means the supporting member 81 approximately corresponds in position to the whole central region 63. Besides, the supporting member 81 is hollow in shape, and such configuration design is not only adapted for the electronic component 92 to be placed in the hollow space 815, but also material-saving and has reduced weight. However, the large-area supporting member is unlimited to be hollow in shape, such as the supporting member 83 in a third preferred embodiment of the present invention as shown in FIG. 6.

Figure 6:
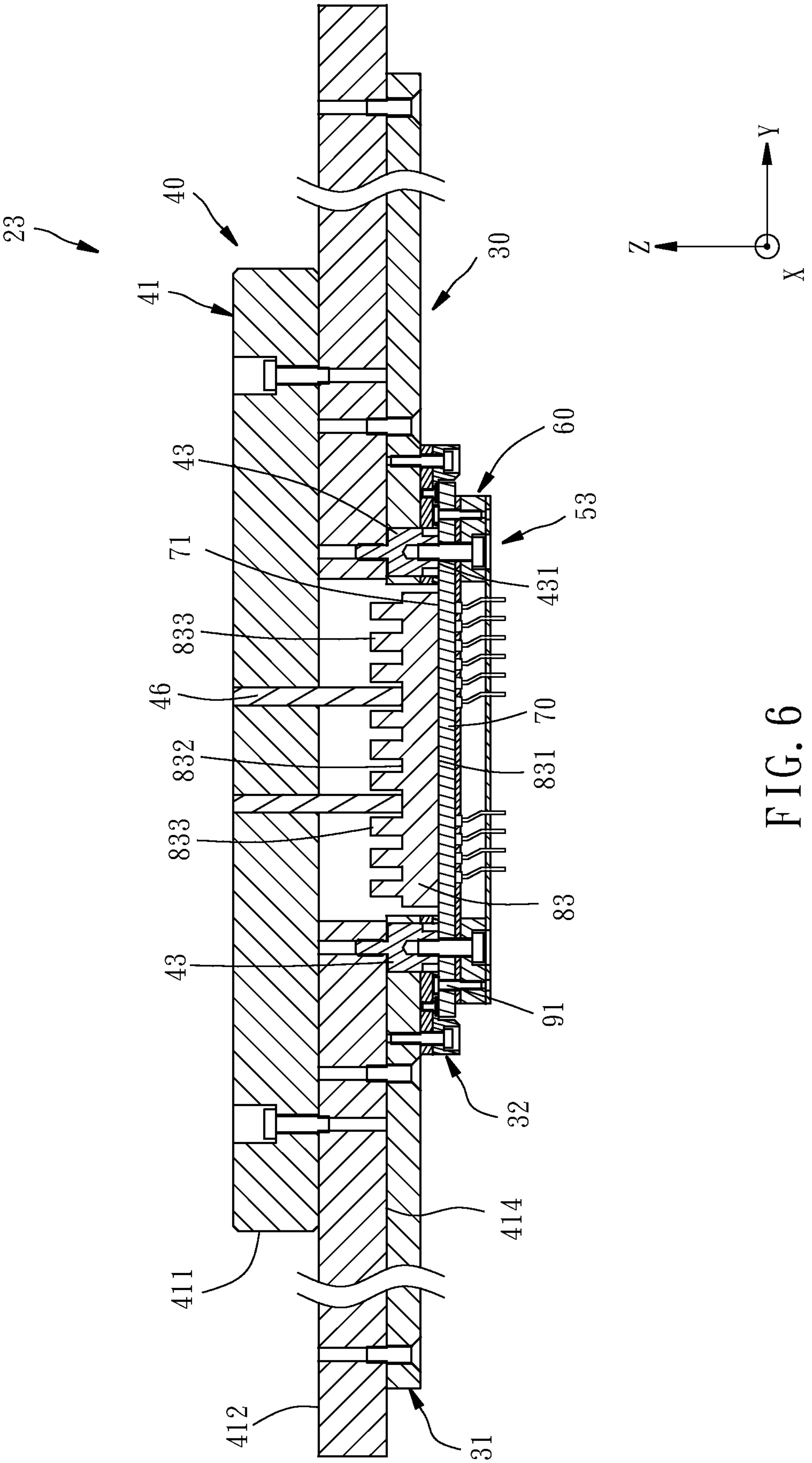
FIG. 6 is a sectional view of a probe card according to a third preferred embodiment of the present invention.

As shown in FIG. 6, a probe card 23 according to a third preferred embodiment of the present invention is similar to the probe card 21 shown in FIG. 2, but the supporting member 83 of the DUT side module 53 in this embodiment has no hollow space. The lower surface 831 of the supporting member 83 is a full large-area plane, and fixed to the upper surface 71 of the space transformer 70 by welding in a direct contact manner. In this way, the structural strength, flatness and heat dissipation effect of the space transformer 70 can be further improved. Besides, the supporting member 83 in this embodiment further has a plurality of heat dissipation fins 833 protruding from the upper surface 832 along Z-axis, so that the supporting member 83 has increased surface area to result in further improved heat dissipation effect.

Figure 7:
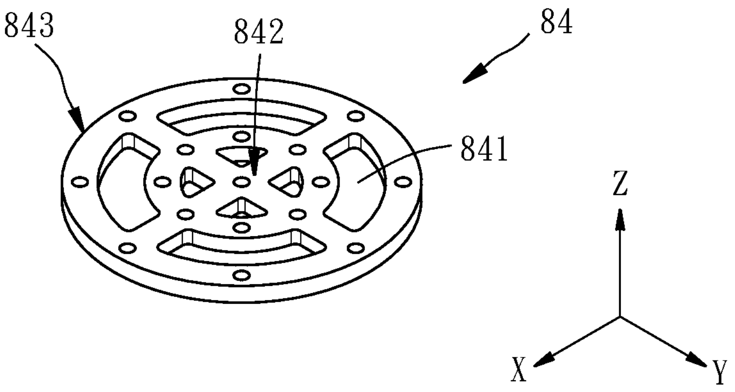
FIG. 7 to FIG. 13 are schematic perspective views of a supporting member of the DUT side module provided by the present invention.
Figure 8:
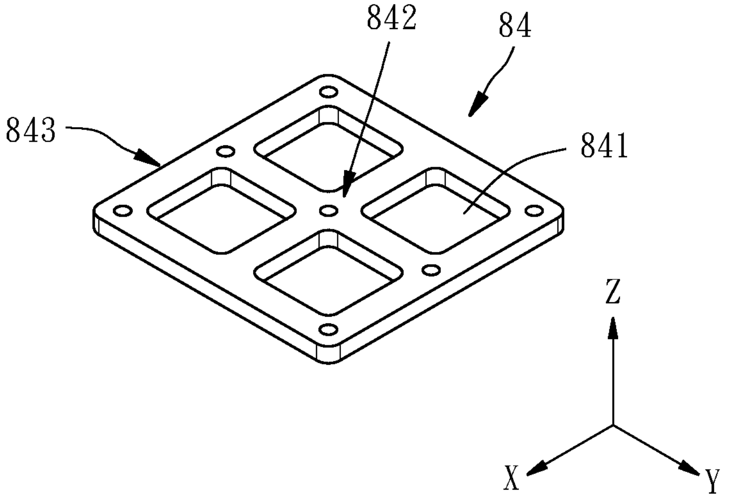
Figure 9:
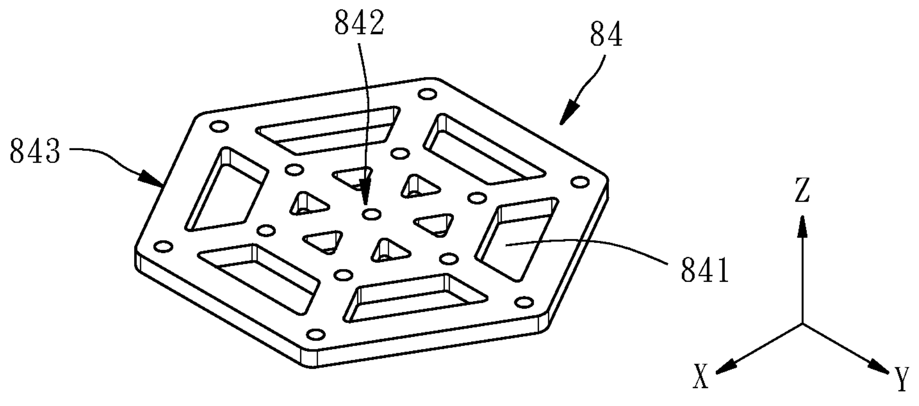
Figure 10:
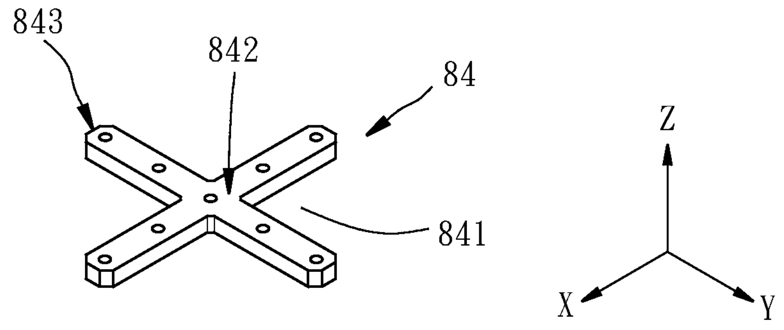
Figure 11:
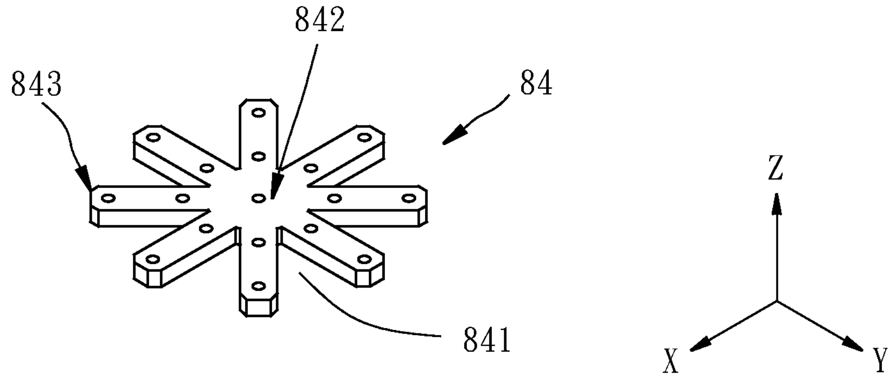
Figure 12:
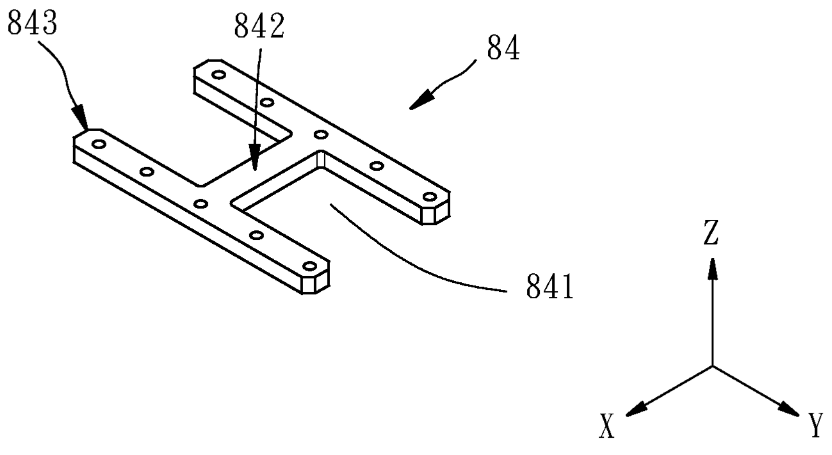
Figure 13:
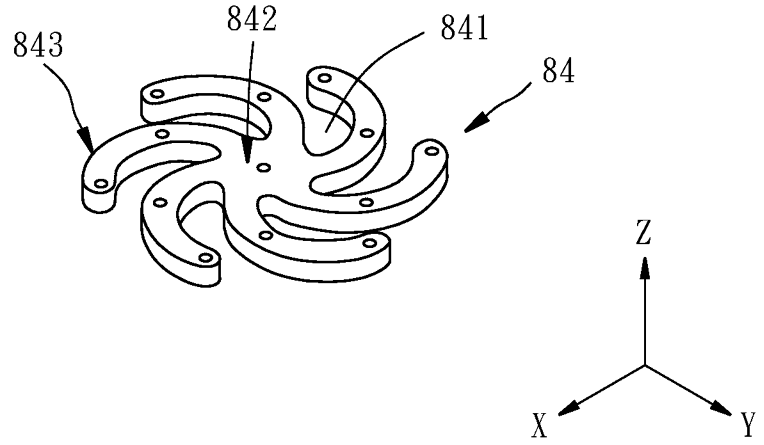

In addition, another kind of supporting member, which is hollow in shape in the top view (or planar view), may be hollow-square-shaped, hollow-grid-shaped, radially shaped, and so on. For example, the supporting members 84 shown in FIG. 7 to FIG. 13 all have a plurality of hollow spaces 841 for accommodating electronic components. The supporting members 84 shown in FIG. 7 to FIG. 13 are all shaped as a hollow flat board. However, the supporting members 84 may be also provided with supporting portions similar to the supporting portions 812 of the supporting member 81 as shown in FIG. 3, such that the bottom of the supporting member has a holding-up configuration. The base portion 811 of the supporting member 81 as shown in FIG. 3 may be non-hollow shaped, or may be hollow shaped similarly to the supporting members 84 shown in FIG. 7 to FIG. 13. When the probe card needs to be provided with the supporting member with a relatively larger area, the above-described hollow shaped supporting member is material-saving, has reduced weight, and can still improve the structural strength and flatness of the space transformer and bring great heat dissipation effect. The hollow space 841 may be such closed type as shown in FIG. 7 to FIG. 9, which doesn't communicate with the external space, or may be such open type as shown in FIG. 10 to FIG. 13, which communicates with the external space. Under some test conditions, the hollow space 841 of the open type can further increase the heat dissipation effect. Besides, no matter the hollow space 841 of the supporting member 84 belongs to the open type or the closed type, the supporting member 84 can be further divided into a central region 842 and a peripheral region 843. The peripheral region 843 extends from the central region 842 to the periphery. For example, in FIG. 10 and FIG. 11, the peripheral region 843 of the supporting member 84 refers to the radial portion extending from the central region 842 to the periphery. That means, the peripheral region 843 of the supporting member 84 can be abutted by the central supporting element for providing supporting strength, and can also serve as heat dissipation fins extending on X-Y plane (perpendicular to Z-axis) from the central region 842.

Referring to FIG. 14, for the simplification of the figure and the convenience of illustration, every component shown in FIG. 14 is schematically drawn in a simplified manner. As described above and shown in FIG. 14, the probe card provided by the present invention is adapted for testing the device under test 150, so the present invention further provides the following testing system 100, testing method, method of producing a tested device, and tested device.

The testing system 100 of the present invention includes a chuck 110, a probe card 120, a signal generator 132, and a signal analyzer 134.

The device under test 150 is formed on a substrate 160. The chuck 110 is configured to support the substrate 160. The substrate 160 shown in FIG. 14 is provided thereon with two devices under test 150. However, the amount of the device under test 150 on the substrate 160 is unlimited. Each device under test 150 includes at least one contact 152 (e.g. PAD or Bump). Examples of the device under test 150 include a semiconductor device, an electronic device, an optical device, and/or an optoelectronic device. Examples of the substrate include a wafer, a semiconductor wafer, a silicon wafer, a gallium arsenide wafer, and/or a type III-V semiconductor wafer.

The probe card 120 may be any type of probe card provided by the present invention, such as the above-described probe card 21, 22 or 23, whose structure is described above and shown in FIG. 2 to FIG. 13, thereby not repeatedly described hereinafter. The probe card 120 is configured to be electrically connected with the device under test 150 in a way that the probes 62 of the probe card 120 is in contact with the contacts 152 of the device under test 150. Specifically speaking, the chuck 110 and/or the probe card 120 is moved by a movement device (not shown), which means the device under test 150 may be unmoved and the probe card 120 is moved, or the probe card 120 may be unmoved and the device under test 150 is moved, or they may be both moved. The movement device firstly makes the probes 62 correspond in position to the contacts 152 of the device under test 150 along the vertical axis, and then makes the probe card 120 and the device under test 150 approach each other along the vertical axis to make the probes 62 in contact with the contacts 152 of the device under test 150, so that the contacts 152 of the device under test 150 are electrically connected with the probes 62 of the probe card 120.

The probe card 120 is configured to be electrically connected to a tester 130. The signal generator 132 in the tester 130 is configured to generate a test signal for the probe card 120 to transmit the test signal to the device under test 150, and a resultant signal is transmitted from the device under test 150 through the probe card 120 back to the tester 130. The resultant signal is received and analyzed by the signal analyzer 134 in the tester 130, such that the device under test 150 is tested.

The testing method of the present invention includes the steps of providing the aforementioned probe card 120, electrically connecting the probe card 120 with the device under test 150 by making the probe 62 of the probe card 120 in contact with the contact 152 of the device under test 150, and testing the device under test 150 by using the probe card 120 to transmit signal between the device under test 150 and the tester 130.

The method of producing a tested device of the present invention includes the steps of providing the aforementioned probe card 120, providing the aforementioned device under test 150, electrically connecting the probe card 120 with the device under test 150 by making the probe 62 of the probe card 120 in contact with the contact 152 of the device under test 150, and testing the device under test 150 by using the probe card 120 to transmit signal between the device under test 150 and the tester 130.

The tested device of the present invention is tested by a testing process. The testing process is performed by using the aforementioned probe card 120. In other words, the tested device and the device under test mentioned in the present invention are the same component. After the device under test is finished being tested by the aforementioned testing method, which is also called testing process, the device under test becomes the tested device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

For example, although it is mentioned in the embodiment as shown in FIG. 5 that the part of the upper surface 71 of the space transformer 70 located correspondingly to the central region 63 of the probe head 60 is saved with an installation section 711 located on the periphery of the supporting member 82 and the installation section 711 is adapted to be disposed with the electronic component 92 mentioned in the first preferred embodiment, the present invention is unlimited thereto. When the supporting member 82 is a small-sized supporting member, the electronic component 92 can be arranged in the part of the upper surface 71 of the space transformer 70 located correspondingly to the peripheral region 64, which is the section not corresponding in position to the probes 62.

What is claimed is:

1. A probe card comprising:

a probe head comprising a probe seat, and a plurality of probes disposed to the probe seat, the probe head being defined with a central region comprising the probes, and a peripheral region located on a periphery of the central region;

a space transformer comprising an upper surface and a lower surface, which face toward opposite directions, the probe seat being attached to the lower surface of the space transformer, the probes being electrically connected with the space transformer;

a supporting member made of metal and comprising an upper surface and a lower surface, which face toward opposite directions, the lower surface of the supporting member being disposed to the upper surface of the space transformer in a direct contact manner and located correspondingly to the central region;

a main circuit board unit comprising a main circuit board, the main circuit board comprising an upper surface and a lower surface, which face toward opposite directions;

a structure stiffener unit comprising a base and a plurality of supporting elements, each of the supporting elements protruding out of a lower surface of the base, the supporting elements comprising at least one central supporting element located correspondingly to the central region, and at least one peripheral supporting element located correspondingly to the peripheral region, the upper surface of the main circuit board being disposed to the lower surface of the base, the central supporting element and the peripheral supporting element being inserted in the main circuit board unit, a lower end surface of the peripheral supporting element being lower in position of height than the lower surface of the main circuit board, the lower end surface of the peripheral supporting element being abutted against the upper surface of the space transformer and coplanar with the lower surface of the supporting member, so that the lower surface of the main circuit board and the upper surface of the space transformer have a distance therebetween, the central supporting element being abutted against the upper surface of the supporting member; and a plurality of bolts inserted through the probe head and the space transformer, and fixedly screwed into the supporting elements of the structure stiffener unit.

2. The probe card as claimed in claim 1, wherein the supporting member is hollow in shape and has at least one hollow space.

3. The probe card as claimed in claim 2, wherein the probe card further comprises at least one electronic component; the electronic component is attached to the upper surface of the space transformer and located in the hollow space of the supporting member.

4. The probe card as claimed in claim 1, wherein the space transformer is a multi-layer ceramic substrate; the upper surface of the space transformer has an installation section located on a periphery of the supporting member and located correspondingly to the central region; the installation section is adapted to be disposed with at least one electronic component.

5. The probe card as claimed in claim 1, wherein the space transformer is a multi-layer organic substrate; the supporting member is located correspondingly to all of the probes; the supporting member is hollow in shape and has at least one hollow space.

6. The probe card as claimed in claim 1, wherein the supporting member has a plurality of heat dissipation fins protruding from the upper surface of the supporting member.

7. The probe card as claimed in claim 1, wherein the supporting member is fixed to the space transformer by welding; the probe card further comprises a plurality of fasteners; the space transformer and the probe seat are fastened to each other by the fasteners, so that the probe head, the space transformer, the supporting member and the fasteners compose a DUT side module which is detachably disposed on the structure stiffener unit.

8. A testing method for testing a device under test, the device under test being formed on a substrate, the device under test comprising at least one contact, the testing method comprising the steps of:

providing the probe card as claimed in claim 1;

electrically connecting the probe card with the device under test by making the probe of the probe card in contact with the contact of the device under test; and testing the device under test by using the probe card to transmit a signal between the device under test and a tester.

9. A method of producing a tested device, the method comprising the steps of:

providing the probe card as claimed in claim 1;

providing a device under test, the device under test being formed on a substrate, the device under test comprising at least one contact;

electrically connecting the probe card with the device under test by making the probe of the probe card in contact with the contact of the device under test; and testing the device under test by using the probe card to transmit a signal between the device under test and a tester.

10. A tested device, the tested device being tested by a testing process, the testing process being performed by using the probe card as claimed in claim 1.

11. A testing system for testing a device under test, the device under test being formed on a substrate, the device under test comprising at least one contact, the testing system comprising:

a chuck configured to support the substrate;

the probe card as claimed in claim 1, which is configured to be electrically connected with the device under test in a way that the probe of the probe card is in contact with the contact of the device under test;

a signal generator electrically connected with the probe card for generating a test signal for the probe card to transmit the test signal to the device under test; and a signal analyzer electrically connected with the probe card for receiving a resultant signal through the probe card and analyzing the resultant signal.

12. A probe card comprising:

a probe head comprising a probe seat, and a plurality of probes disposed to the probe seat; the probe head being defined with a central region comprising the probes, and a peripheral region located on a periphery of the central region;

a space transformer comprising an upper surface and a lower surface, which face toward opposite directions; the probe seat being attached to the lower surface of the space transformer, and the probes being electrically connected with the space transformer;

a main circuit board comprising an upper surface and a lower surface, which face toward opposite directions; the main circuit board being electrically connected with the space transformer and located above the space transformer;

a structure stiffener unit comprising a base, a plurality of peripheral supporting elements and a reinforcing block; each of the peripheral supporting elements protruding out of a lower surface of the base and being located correspondingly to the peripheral region; the reinforcing block having a lower surface abutted against the upper surface of the space transformer and located correspondingly to the central region; the upper surface of the main circuit board being disposed to the lower surface of the base; the reinforcing block and each of the peripheral supporting elements being inserted in the main circuit board; and a plurality of bolts inserted through the probe head and the space transformer, and fixedly screwed into the peripheral supporting elements;

wherein the peripheral supporting elements and the probe head collectively clamp the space transformer at positions of the upper and lower surfaces of the space transformer respectively corresponding to the peripheral region of the probe head, the reinforcing block and the probe head collectively clamp the space transformer at positions of the upper and lower surfaces of the space transformer respectively corresponding to the central region of the probe head, and each of the peripheral supporting elements has a lower end surface coplanar with the lower surface of the reinforcing block, thereby forming a sandwich structure in which the probe head and the structure stiffener unit collectively clamp the space transformer;

wherein the lower end surface of each of the peripheral supporting elements is lower in position of height than the lower surface of the main circuit board and abuts against the upper surface of the space transformer, so that a distance is defined between the lower surface of the main circuit board and the upper surface of the space transformer, thereby forming a suspended structure in which the space transformer is spacedly disposed below the main circuit board.

13. A method of making a probe card, comprising the steps of:

providing a probe head comprising a probe seat and a plurality of probes disposed to the probe seat, the probe head being defined with a central region comprising the probes, and a peripheral region located on a periphery of the central region;

providing a space transformer comprising an upper surface and a lower surface, which face toward opposite directions, and attaching the probe seat to the lower surface of the space transformer in a way that the probes are electrically connected with the space transformer;

providing a main circuit board comprising an upper surface and a lower surface, which face toward opposite directions, and disposing the main circuit board above the space transformer in a way that the main circuit board is electrically connected with the space transformer;

providing a structure stiffener unit comprising a base, a plurality of peripheral supporting elements each protruding out of a lower surface of the base, and a reinforcing block, and disposing the upper surface of the main circuit board to the lower surface of the base in a way that each of the peripheral supporting elements is inserted in the main circuit board and located correspondingly to the peripheral region, and the reinforcing block is inserted in the main circuit board and has a lower surface abutted against the upper surface of the space transformer and located correspondingly to the central region; and inserting a plurality of bolts through the probe head and the space transformer to be fixedly screwed into the peripheral supporting elements;

wherein the peripheral supporting elements and the probe head collectively clamp the space transformer at positions of the upper and lower surfaces of the space transformer respectively corresponding to the peripheral region of the probe head, the reinforcing block and the probe head collectively clamp the space transformer at positions of the upper and lower surfaces of the space transformer respectively corresponding to the central region of the probe head, and each of the peripheral supporting elements has a lower end surface coplanar with the lower surface of the reinforcing block, thereby forming a sandwich structure in which the probe head and the structure stiffener unit collectively clamp the space transformer;

wherein the lower end surface of each of the peripheral supporting elements is lower in position of height than the lower surface of the main circuit board and abuts against the upper surface of the space transformer, so that a distance is defined between the lower surface of the main circuit board and the upper surface of the space transformer, thereby forming a suspended structure in which the space transformer is spacedly disposed below the main circuit board.

* * * * *